United States Patent [19]
Van Brunt et al.

[11] Patent Number: 5,504,458
[45] Date of Patent: Apr. 2, 1996

[54] CMOS CLASS AB AMPLIFIER FOR DRIVING CAPACITIVE AND RESISTIVE LOADS

[75] Inventors: Roger Van Brunt, San Francisco; Florin Oprescu, Sunnyvale, both of Calif.

[73] Assignee: Apple Computer, Inc., Cupertino, Calif.

[21] Appl. No.: 316,210

[22] Filed: Sep. 30, 1994

[51] Int. Cl.$^6$ ............................................. H03F 3/26
[52] U.S. Cl. ................................. 330/255; 330/267
[58] Field of Search ................................ 330/253, 255, 330/267, 264, 292, 265

[56] References Cited

U.S. PATENT DOCUMENTS

| | | | |
|---|---|---|---|
| 4,454,479 | 6/1984 | Spires | 330/267 |
| 4,588,961 | 5/1986 | Rao | 320/267 |
| 5,315,266 | 5/1994 | Lorenz | 330/255 X |

FOREIGN PATENT DOCUMENTS

| | | | |
|---|---|---|---|
| 2853019 | 6/1979 | Germany | 330/255 |

OTHER PUBLICATIONS

Dennis M. Monticelli, *A Quad CMOS Single–Supply Op Amp with Rail–to–Rail Output Swing*, IEEE Journal of Solid–State Circuits, vol. sc-21, No. 6, Dec. 1986, pp. 1026–1034.

*Primary Examiner*—Steven Mottola
*Attorney, Agent, or Firm*—Blakely, Sokoloff, Taylor & Zafman

[57] ABSTRACT

The class AB amplifier is configured to provide low quiescent current while achieving high internal switching rates. The buffer is connected to a large external capacitance which provides external compensation. The amplifier includes an input stage which converts differential voltages to current. An output stage provides an output current and also provides a feedback current into the input stage. A biasing network provides voltage for biasing various nodes within the amplifier. Cross-coupling is provided within the output stage for achieving a low quiescent current. A pair of current limiting circuits, one for p-channel element and another for n-channel elements, is also provided.

6 Claims, 3 Drawing Sheets

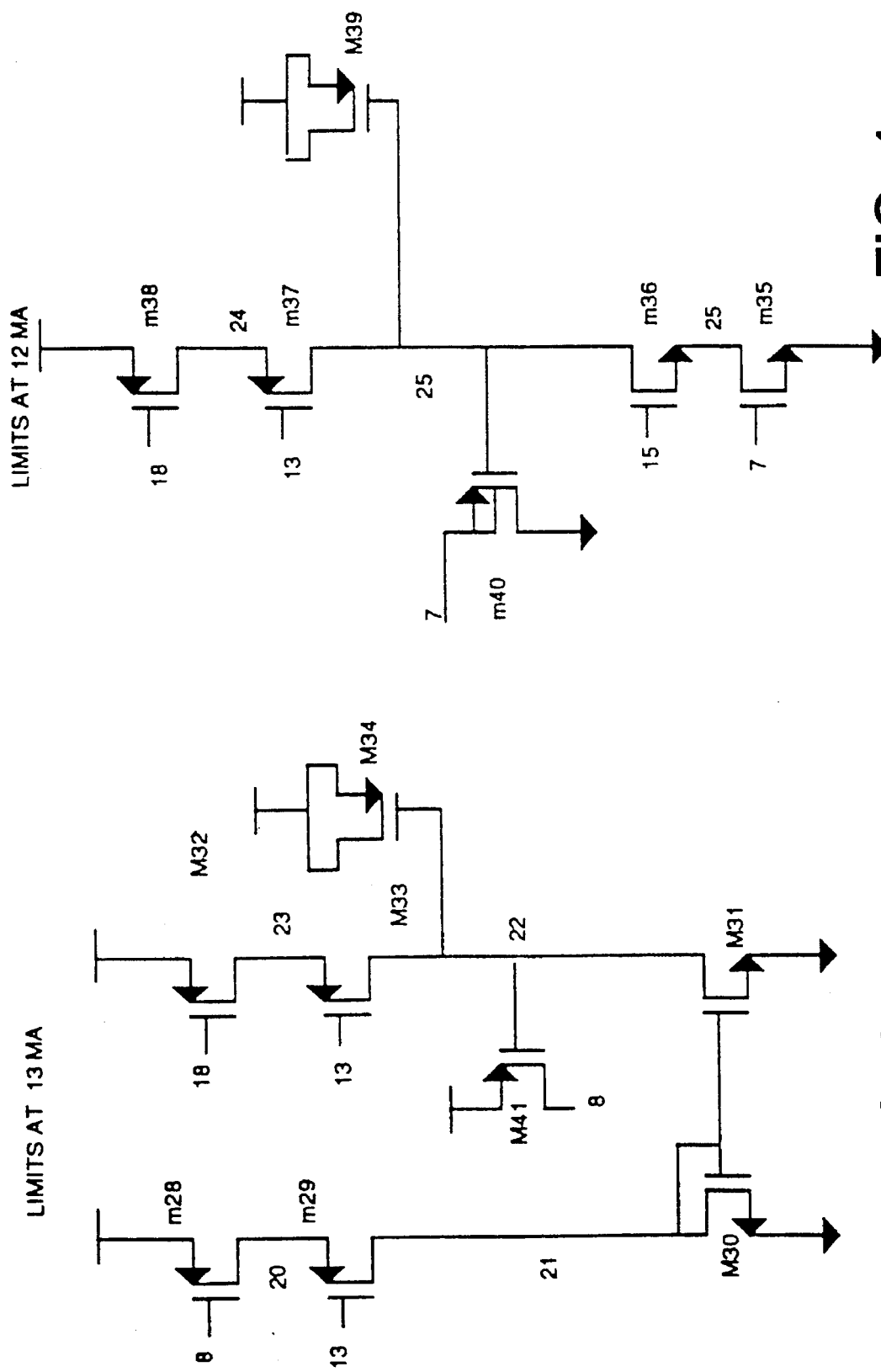

CMOS CLASS AB AMPLIFIER FOR DRIVING CAPACITIVE AND RESISTIVE LOADS

BACKGROUND OF THE INVENTION

1. Related Applications

This application is related to U.S. patent application Ser. No. 08/034,561, filed Mar. 19, 1993, entitled "Method and Apparatus for Implementing a Common mode Level Shift in a Bus Transceiver Incorporating a High-speed Binary Data Transfer mode with a Ternary Control Transfer mode", which is assigned to the assignee of rights to the present application and which is incorporated by reference herein.

2. Field of the Invention

The CMOS generally relates to class AB amplifiers or buffers and in particular to a class AB amplifier for use as a voltage bias within a bus transceiver configured according to IEEE P1394 specifications.

3. Description of Related Art

One common class of amplifiers are class AB amplifiers. Class AB amplifiers are employed particularly where it is desirable to have a low quiescent current, such as for low power computer applications including portable or notebook computers. A class AB amplifier may consume, for example, only 0.5 milliamps of current in the quiescent state while providing 9 milliamps of current on demand.

In certain applications, it is desirable to provide a class AB amplifier which not only provides low quiescent current but also achieves rail to rail output swings when current is required. An example of such a class AB amplifier is described in "A Quad CMOS Single Supply Amplifier with Rail to Rail Output Swing", D. M. Monticelli, IEEE J. Solid-state Circuits, Vol. SC-21, pp. 1026–1034, December, 1986. Although the amplifier described by Monticelli achieves rail to rail output swings as well as a low quiescent current, it requires a rather complicated circuit topology. The complicated topology arises, in part, from the need to provide a compensation node within the amplifier. The compensation node is implemented by providing an internal capacitive load within the amplifier. However, for certain applications, such as driving large capacitive loads, it is desirable to achieve the highest possible switching speed for nodes within the amplifier.

The internal capacitive node within the amplifier of Monticelli, which is provided to achieve compensation, results in relatively low switching speeds for large capacitive loads.

Moreover, the circuit topology of Monticelli employs bipolar junction transistors which, in general, are poorly characterized devices in standard CMOS digital processes. More specifically, the Monticelli amplifier uses complex input drive circuits and bias circuits for its output stage. A first stage with a single-ended output drives the class AB output stage with a single-ended input through an intermediary single-ended amplifier stage. The presence of the intermediary stage introduces significant poles in the overall frequency transfer characteristic of the amplifier and requires the use of elaborate additional stabilization circuits. To guarantee the overall frequency stability of the amplifier at least some of the active devices used by the intermediary amplifier stage must be bipolar junction transistors.

It would be desirable to provide a class AB amplifier requiring only a low quiescent current for use in connection with a large external load capacitance. It would also be desirable to provide such a class AB amplifier configured such that it avoids the use of bipolar junction transistors and is thereby completely compatible with standard digital CMOS processes. It is to these ends that certain aspects of the present invention are drawn.

One application requiring a class AB amplifier having low quiescent current, as well as high switching speeds, is an amplifier for use as a voltage bias in a bus transceiver configured in accordance with IEEE P1394 specifications. IEEE P1394 provides the specifications for a computer bus system, also referred to as "Firewire", for interconnecting computer components such as modems, laser printers, laptop computers and the like. In accordance with IEEE P1394 specifications, each node of the bus system includes an integrated circuit bus transceiver chip which allows communication to other nodes. An external decoupling capacitance is provided in connection with each bus transceiver integrated chip. Each bus transceiver requires a voltage bias source, such as an operational amplifier, for biasing up twisted pair interconnection lines. Low quiescent current is desirable for such a voltage bias source since the bus transceiver chip incorporating the voltage bias source may be provided within battery powered computer elements such as notebook computers and the like. Also, it is desirable for the voltage bias source to be able to operate with a low voltage power supply such as a 3 volt power supply.

Moreover, an amplifier for use within a system configured in accordance with IEEE P1394 specifications must have very high power efficiency. The great majority of the time the amplifier is idle, i.e. the amplifier has no significant output current demand, and, as such, must use only a minimum amount of current from the power supply. When active, the amplifier is required to provide a large output current to drive capacitive and resistive loads. These considerations place significant constraints on the selection of the circuit topology for the amplifier. An improved amplifier of the type described above for use in a system providing the external decoupling capacitance would be highly advantageous. Accordingly, aspects of the invention are drawn to the provision of an improved amplifier within a bus transceiver, particularly one configured according to IEEE P1394 specifications.

A common problem in conventional class AB amplifiers is that the amplifiers are not current limiting and therefore may output a continuous high current in the event of a short circuit. Such a short circuit may occur, between two adjacent communication nodes connected in an IEEE P1394 configuration, when one of the two nodes is powered down. In some circuits, the high output current occurring as a result of the short circuit may permanently damage other components of the circuit or other devices connected to the circuit or cause the batteries to run down. Accordingly, it would also be desirable to provide an improved class AB amplifier of the type described above but having a circuit topology which achieves current limiting, wherein the amount of current output from the amplifier is limited even upon the occurrence of a short circuit.

BRIEF SUMMARY OF THE INVENTION

In accordance with one aspect of the invention, a class AB amplifier is provided for use in connection with an external decoupling load capacitance wherein the amplifier provides low quiescent current and achieves high internal switching rates. The amplifier is also current limited.

The amplifier includes a input stage receiving the voltage input signal and the bias current. The input stage is connected to an output stage having a set of cross-coupled transistors. The cross-coupled transistors allow a differential output of the input stage of the amplifier to directly drive a differential input of the output stage of the amplifier, thereby eliminating the need for an intermediary stage which is required in many prior art class AB amplifiers. The cross-coupled transistors of the output stage also help achieve an overall low quiescent current while also allowing high switching rates. Overall frequency stability for the amplifier is ensured by providing a substantial output capacitive load.

A current limiting stage is provided which allows the amplifier to tolerate continuous faults to ground. Thus, any short-circuits which may occur do not result in a damaging high output current or large current drain on the battery.

The amplifier is configured with CMOS components and is connected to a power supply which may range, for example, from 2.9 volts to 5.5 volts. The amplifier receives, also as an example, a 25 micro amp bias current and a 1.83 volt input voltage. The amplifier is configured as a voltage follower. An output voltage line is connected to an external capacitance which may be, for example, 5 micro farads. A quiescent current of 0.5 milliamps is consumed and a current of 9 milliamps may be provided upon demand. The amplifier also includes a biasing stage and a current limiting stage.

The amplifier is advantageously employed in a bus transceiver of a bus system configured in accordance with IEEE P1394 specifications wherein the amplifier is employed to provide a bias voltage to a set of twisted pair interconnection lines.

Thus, the operational amplifier of the invention achieves the general objectives set forth above. Other objects and advantages of the invention will be apparent from the description which follows. Although the amplifier is advantageously employed as a voltage bias source within a bus transceiver configured in accordance with IEEE P1394 specifications, the amplifier may also be employed in other circuits and applications, particularly those requiring low quiescent current and high switching rates. The amplifier is particularly well suited in systems providing a large external capacitive load.

BRIEF DESCRIPTION OF THE DRAWINGS

FIG. 3 is a circuit schematic illustrating a current limiting circuit portion of the amplifier of FIG. 1 for limiting the P-channel elements.

FIG. 4 is a circuit schematic illustrating a current limiting portion of the amplifier of FIG. 1 which limits the N-channel elements.

DETAILED DESCRIPTION OF THE INVENTION

The present invention relates to a method and apparatus for implementing an improved class AB amplifier. In the following description, numerous details are set forth such as specific voltages, currents, etc., in order to provide a thorough understanding of the invention. However, these details may not be required to practice the present invention.

Figure 1:
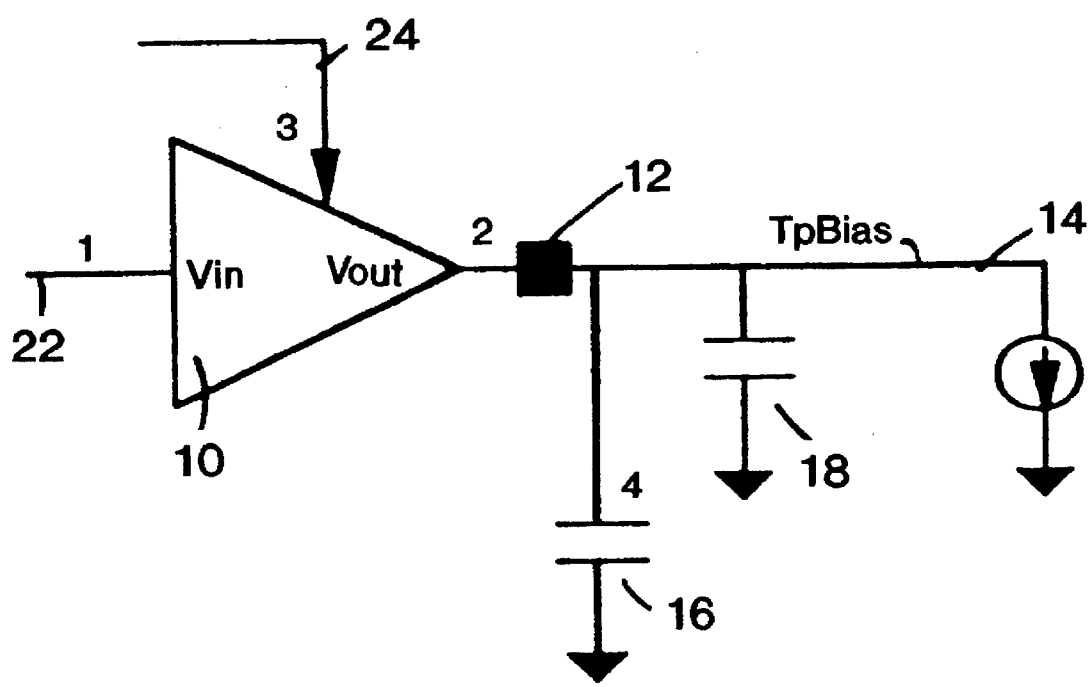
FIG. 1 illustrates an amplifier configured in accordance with principles of the invention.

Referring to FIGS. 1–4 exemplary embodiments of the invention will now be described. FIG. 1 illustrates a class AB amplifier 10 connected through an output pad 12 to an output line 14. A pair of capacitors 16 and 18 are connected between output line 14 and ground.

Amplifier 10 receives a voltage input signal $V_{in}$ along line 22 and a bias current input along line 24.

In an exemplary embodiment, the voltage input signal $V_{in}$ is 1.83 volts and the input bias current is 25 µA. Capacitor 16 provides a capacitance of 5 microfarads and capacitor 18 provides the capacitance of 0.3 microfarads. Capacitor 16 has a parasitic resistance of between 0 and 1 ohms. In a quiescent state amplifier 10 draws 0.5 milliamps of current. In an active state amplifier 10 is capable of providing 9 milliamps of current or capable of sinking 4 milliamps of current along line 14.

Figure 2:
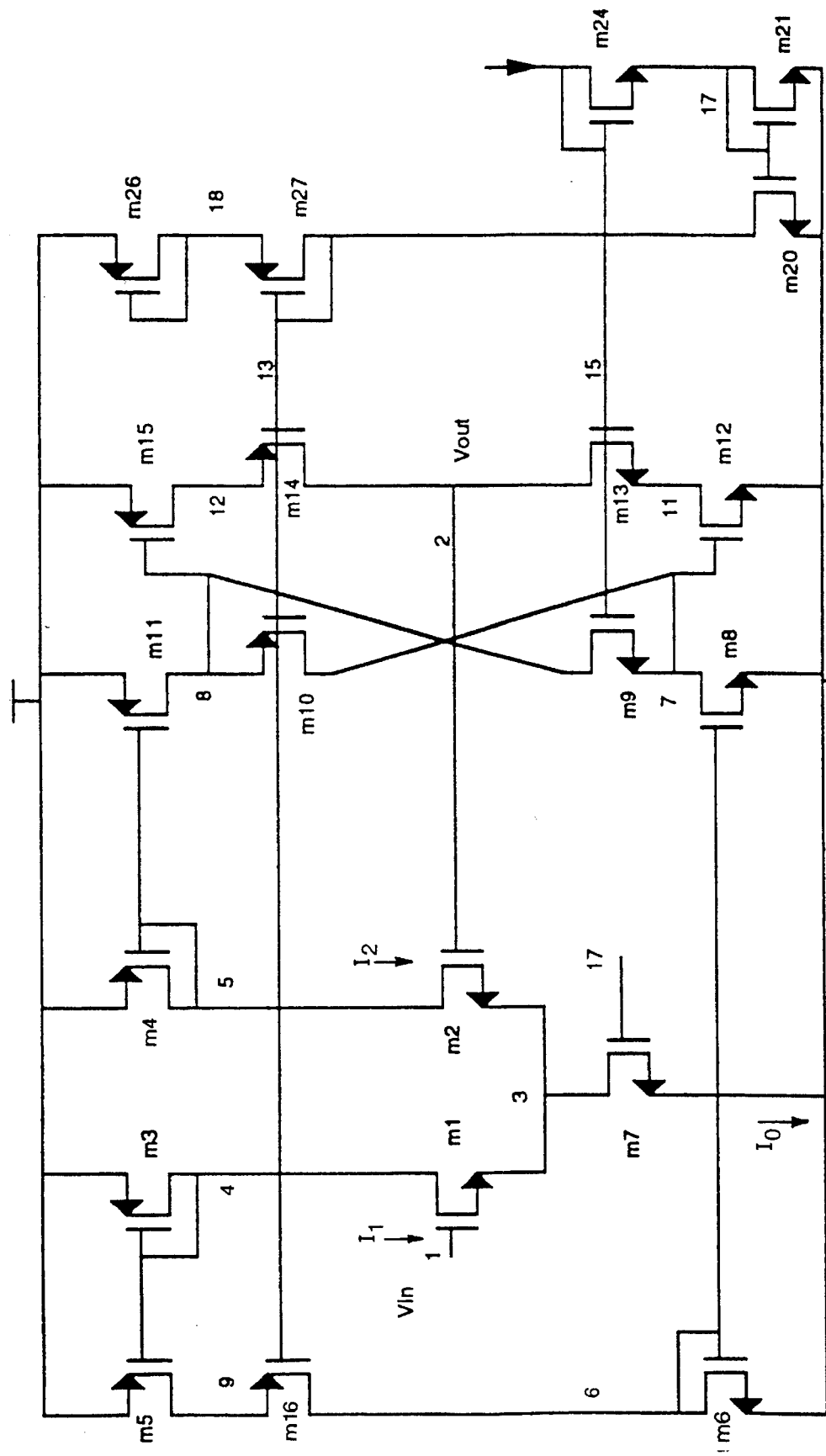
FIG. 2 is a circuit schematic illustrating a portion of the amplifier of FIG. 1.

FIG. 2 is a schematic diagram illustrating an exemplary configuration of amplifier 10. Amplifier 10 includes twenty-one CMOS transistors interconnected as shown. Within the FIG. 2, the CMOS transistors are identified by labels, such as m1, m2, etc. Reference numerals in FIG. 2 identify nodes within the circuit. A $V_{in}$ signal provided along line 22 is received by transistor m1. The current bias signal provided along line 24 is received by transistor m24. The output voltage signal $V_{out}$ is output along line 14 as shown and is also connected to a transistor m2 for providing a voltage follower feedback connection.

Transistors m1 and m2 provide a differential amplifier for receiving the $V_{in}$ and $V_{out}$ signals. Transistors m1–m7, m8, m11, and m16 together provide an input stage which converts a difference in voltage between $V_{in}$ and $V_{out}$ to a current. Transistors m9, m10, m12–m15 together provide an output stage for generating the output voltage $V_{out}$. Remaining elements m20–m21, m24 and m26–m27 provide a biasing network stage. A current limiting stage is illustrated in FIGS. 3 and 4, described below.

In the circuit configuration of FIG. 2, gate terminals of transistors m8 and m11 are employed as direct differential inputs for the output stage of the amplifier. Furthermore, transistors m8 and m11 are directly driven by differential outputs of the remaining elements of the input stage of the amplifier. This is in contrast to class AB amplifiers of the prior art, such as the Monticelli circuit described above, wherein transistors corresponding to transistors m8 and m11 of FIG. 2 are employed as constant current sources. The overall circuit configuration of the circuit of FIG. 2, particularly the manner by which m8 and m11 are configured and interconnected, helps reduce the significance of internal poles of the amplifier yielding an overall amplifier having a single dominant pole at its output node. As such, overall amplifier stability can be effectively guaranteed by the output capacitive load (FIG. 1). The use of a differentially-driven output stage also eliminates some additional circuits required in prior art class AB amplifiers to maintain overall amplifier stability when its output is limiting against one of the power supply rails.

With regard to transistors m13 and m14, in applications wherein the provision of rail to rail output voltage swings are not critical and where a mostly capacitive output load is provided, output cascode transistors m13 and m14 help achieve a significant increase in overall amplifier gain. In other applications such as applications where rail to rail voltage swings are critical, it may be desirable to configure the amplifier without transistors m13 and m14.

The functions of the various transistors and interconnections of amplifier 10 will now be described in greater detail. As noted, transistors m1–m4 and m7 provide a front end to the amplifier with transistors m1 and m2 acting as a differential amplifier. Transistor m7 provides a bias current, also referred to as a tail current, to the front end of the amplifier. Transistors m3 and m4 are provided to mirror the current provided by the differential amplifier transistors m1 and m2. Hence, the current output from transistor m2 flows through transistor m4 and is mirrored into transistor m11. Also, the current from transistor m1 flows into the mirror of transistor m3 and m5. Transistor m16 is a cascode transistor which cascodes m5. Cascode transistor m16 is provided for offset reasons, discussed below.

Thus, current provided by transistor m1 is mirrored through transistors m3 and m5 and then is mirrored again through transistors m6 and m8. Likewise, current from m2 is mirrored through m4 and m11. In this manner, a front end stage operates to convert the differential voltage input to m1 and m2 to a current which is transmitted out of the input stage through m11 and m8. The magnitude of the current flow illustrated in FIG. 2, with the current through m7 represented by $I_0$ and the current through m1 and m2 represented by $I_1$ and $I_2$, where $I_1$ and $I_2$ are typically both equal to one-half of $I_0$.

In an exemplary embodiment, the current of $I_0$ is 50 milliamps such that, in a quiescent state, 25 micro amps flows through m1 and 25 micro amps flows through m2. Transistors m11 and m8 each provide a current gain of two yielding a current flow through those elements of 50 micro amps. Hence, an overall current gain of two is provided to the output stage.

Regarding the actual layout of the transistors it is desirable to provide a minimum amount of offset within amplifier 10. To achieve minimum offset it is preferable that the above mentioned transistor elements are laid out in a symmetric fashion to reduce any mismatch. In particular, it is desirable to provide transistors m1 and m2 in a common centroid configuration. It is also desirable to employ a channel length of two for transistor elements m1 and m2, as a shorter channel length typically yields greater offset as a result of greater imprecision. Transistor m16 is also provided to help reduce offset and its function will be discussed in detail below.

The operation of the output stage and biasing stage of the amplifier will now be described. Transistor m11 operates as a current source providing a current of $I_0$. Transistor m8 also provides a current source also yielding $I_0$. Transistor m10, which is connected to m11 is a cascode transistor. Transistor m10 is in turn connected to transistor m14 which is also a cascode transistor. Transistors m26 and m27 provide the cascode bias voltage to m10 and m14.

Transistor elements m8–m9, m12–13, m21 and m24, shown in a lower portion of FIG. 2, provide a configuration corresponding to that of elements m11–m10, m15–m14 and m26–m27, shown in an upper portion of FIG. 2. Transistors m21 and m24 provide a biasing network corresponding to that of transistors m26 and m27. The biasing network of m21 and m24 operates to bias up the gates of cascode transistors m9 and m13 and to bias m7.

Although the lower set of elements illustrated in FIG. 2 are symmetric with the upper set of elements in FIG. 2, it should be noted that the lower elements are generally N-channel transistors where the upper elements are P-channel transistors, and vice-versa. Also, transistor elements m24 and m21 receive the bias current of, for example, 25 micro amps, along line 24. Corresponding transistor elements m26 and m27 receive the bias current.

Another difference between the lower and upper elements is the provision of transistor m20 connected to transistor m21. The purpose of transistor m20 is to supply current to transistors m26 and m27. Together transistors m20 and m21 provide a current mirror so that current flowing through m21 also flows through transistor m20, thereby forcing an equal amount of current through transistors m26 and m27. In the exemplary embodiment, the amount of current supplied to transistors m26 and m27 is 25 micro amps.

Now, considering transistors m12–m15 in greater detail. As can be seen, the drain of transistor m10 is cross-coupled into the gate of transistor m12 which is connected to the source of m9 and to the drain of m8. Likewise, the drain of transistor m9 is cross-coupled into the gate of transistor m15 which is connected to the source of m10 and the source of m11. The cross-coupling provides a positive feedback circuit with a gain less than one. For example, a decrease in the source voltage of transistor m9 results in a greater amount of current flowing out of transistor m9. The voltage on the source of transistor m10 drops along with the gate voltage of transistor m15. The decrease in the source voltage of m10 operates to turn off m10 resulting in a decrease in current flow through transistor m10. This, in turn, results in a drop in the source voltage of transistor m9 resulting in an increase in the current through transistor m9. Thus, an overall positive feedback loop is provided. With a closed loop gain <1, the loop results in a stable quiescent operating current.

The operation of the amplifier will now be described first with reference to a quiescent operating state and then with reference to an operating state which either provides or draws current. In the quiescent state, no current is input or output along line 14. Accordingly, the current flowing out of transistor m14, $I_{op}$, is equal to the current flowing into transistor m13, $I_{on}$.

In considering the quiescent state, initially it is assumed that all of the P-channel transistors have the same size and all of the N channel transistors have the same size. As will be described below, the sizing may differ in a practical implementation to achieve an overall output gain. For the quiescent state in which there is no load current on output node 14, current through transistor m15 always equals the current through m14 and the current through transistor m13 and m12. To determine the quiescent operating condition assume current from m8 (50 micro amps) is split equally between m9 and m10 so that current from m11 (50 micro amps) is also split equally between m9 and m10. Also since the current in m24 and m9 are both 25 micro amps then node 7 voltage equals node 17 voltage therefore the current density in m12 and m13 equals the current density in m24 and m21 and node 11 equals node 17. The current then in m13 and m12 equals 15×25 micro amps. By symmetry the node voltages of 8, 12 and 18 are the same and the currents through m15 and m14 are equal to 15×25 micro amps and equal to m13, m12 current such that no current flow out on node 14. Here, it was assumed that currents in m11 and m8 were both 50 ua therefore Vin must then equal Vout. In quiescent Vout=Vin and the current in m13, m12 equal to the current in m14, m15 and the current in m11 equal the current in m11 for this to be true the current in m8 must be split equally between m9 and m10 and the current in m11 must be split equally between m9 and m10.

Having established the quiescent condition, the non-quiescent operating mode conditions will now be discussed. First considering an example where an output current of 5 milliamps is drawn from node 14. For amplifier 10 to provide the 5 milliamps, the current flow through transistors m15 and m14 must increase. This occurs as a result of a voltage drop on transistor m2 as a result of a feedback connection from $V_{out}$. Such decreases the current flow through transistor m11 while increasing the current through m8 while causing a similar increase in current through m1. The forgoing results in a drop in the voltage on the gate of transistor m15 resulting in an increase in current through transistor m9 and a decrease in current though transistor m10, ultimately resulting in a complete shutoff in current through transistor m10. Thus, transistor m10 drops to zero current while the current through transistor m9 increases pulling the gate of m15 down. The gate voltage of m12 decreases, so the current through m12 also decreases. Thus, the current through m12 decreases while the current through m15 increases. Ultimately, transistors m12 and m13 drop to much less than 15 or 25 micro amps yielding an increase in current through transistors m14 and m15 sufficient to supply the 5 milliamps. If a current greater than 5 milliamps is provided, then the current through m11 is increased and the current through m8 is decreased thereby pulling the output current back to 5 milliamps. Thus, a negative feedback loop is achieved and a stable 5 milliamps is provided.

Table I, below, provides exemplary sizes for each of the transistors in FIG. 2.

TABLE I

| Transistor | Size | Transistor | Size | Transistor | Size |
|---|---|---|---|---|---|
| m1 | 2 × 30/2 | m8 | 2 × 60/3 | m15 | 15 × 120/1 |
| m2 | 2 × 30/2 | m9 | 1 × 30/1 | m16 | 120/1 |
| m3 | 120/3 | m10 | 1 × 120/1 | m20 | 30/1 |
| m4 | 120/3 | m11 | 2 × 120/3 | m21 | 30/1 |
| m5 | 1 × 120/3 | m12 | 15 × 30/1 | m24 | 30/1 |
| m6 | 1 × 60/3 | m13 | 15 × 30/1 | m26 | 120/1 |
| m7 | 2 × 30/1 | m14 | 15 × 120/1 | m27 | 120/1 |

It should be noted that there is considerable voltage gain through the amplifier given the values of Table I. In particular, the application of the voltage on transistor m2 results in a considerable increase in the voltage on the gate of transistors m15. Two stages of gain are provided, with the first gain from the gate of m1 (m2) to the gate of m12 (m15) and the second from the gate of m12 (m15) to the output. In other embodiments, each stage may have a gain of 100 yielding a total open loop gain of, for example, ten thousand. A large amount of gain is provided, in part, to achieve extremely low offset, since offset is inversely proportional to gain.

Now considering the function of transistor m16, the purpose of transistor m16 is to match, in a quiescent state, transistor m10, such that the current in transistors m5 and m11 match. The better the match between currents through transistors m5 and m11, the lower the overall offset of the amplifier. It is noted that the foregoing analysis of the quiescent and non-quiescent operating state conditions is unaffected by the presence of the m16 transistor which only operates to achieve a close current match between transistors m5 and m11.

Thus, a very low offset is achieved, in part, as a result of the very high gain and with the provision at transistor m16. However, a high gain typically results in poor stabilization, particularly in amplifiers having two levels of voltage gain. In amplifiers having two gain stages, such as the amplifier described in the Monticelli paper described above, a large internal capacitance is typically provided. No such internal capacitance is provided in the amplifier of FIG. 2. Rather, the amplifier at FIG. 2 relies on the 5 microfarad external capacitance illustrated in FIG. 1. It should be noted that capacitor 16 of FIG. 1 may also include a certain amount of parasitic resistance, perhaps between 0 and 1 ohm. It has been found that such a parasitic resistance does not destroy the stabilization provided by the 5 microfarad capacitors.

Thus, the provision of high gain within amplifier 10 necessitates the rather large external capacitance of 5 microfarads. For implementations the amplifier which do not involve a significant amount of gain, a lesser amount of external capacitance is required.

The second capacitor, 18, is provided for reasons unrelated to the stabilization of amplifier 10. More specifically, when output line 14 is connected to a twisted pair line for transmitting high frequency signals, capacitor 18 provides a shunt for the high frequency current.

With reference to FIGS. 3 and 4, the current limiting aspects of amplifier 10 will be described. As noted above, current limiting is provided such that if a short occurs then the amount of current output from the amplifier is limited, thereby preventing damage to other circuits connected to the amplifier. One example of such a short is where the amplifier is connected to a twisted pair line and a node connected to another end of the twisted pair line fails to provide power. Such would result in a huge amount of current draw through the amplifier.

Current limiting is achieved separately for the P-channels and the N-channels. FIG. 3 illustrates a current limiting circuit which provides a limit of 13 milliamps for the P-channels. The current limiting circuit of FIG. 3 includes eight transistors, labeled m28–m34 and m41. Gates of transistors m28 and m29 are connected to nodes 8 and 13 of FIG. 2. Transistors m32 and m33 are connected to nodes 18 and 13 of FIG. 2.

Transistors m28 and m29 are of size 20/1. Transistors m15 and m14 which have a size of 15×120/1. Since transistors m28 and m29 are of 1/90 the size, then only 1/90 the current flows through m28 and m29. In the example wherein 25 micro amps×15 flows through m15 and m14, a current of about 25/6 micro amps flows through m28 and m29. Transistor m30 mirrors that current through transistor m31 but also reduces the current even further because m30 is larger than m31 by a factor of about five, resulting in a current flow of about 0.8 micro amps.

Now considering transistors m32 and m33 which are both 132/1 transistors. Since the gates of m32 and m33 are connected to nodes 18 and 13, respectively, the current through m32 and m33 is somewhat greater than 25 micro amps, and is about 27 micro amps. Hence, only 0.8 micro amps flows into transistor m31 while 27 micro-amps flows out of transistors m33 such that the voltage at node 22 climbs up to the power supply with transistors m41 normally shut off. Note that the drain of m41 is connected to node 8 of FIG. 2. In view of the foregoing, if the output of the amplifier is shorted to ground, then the current through transistors m15 and m14 (FIG. 2) increases significantly, resulting in a drop in voltage on node 8. As the voltage on node 8 drops, the current through m28 increases such that the input current into m31, typically 0.8 micro amps, increases as well.

Thus, the current through transistors m31 increases in proportion to the current through transistor m15 and m14. When the current through m31 increases thirty-four times, the voltage on the gate of m31 drops since the N-channel current is greater than the P-channel current. Note that the current does not change through m32 and m33. When current through m31 increases thirty-four times, the current exceeds the P-channel current such that the gate voltage of m41 suddenly drops and m41 turns on pumping current into node 8 from the power supply. The increase in current at node 8 starts to turn off transistor m15 (FIG. 2), thereby achieving the current limiting.

Hence, the current limiting circuit of FIG. 3 does not allow the current to increase more than thirty-four times. In the example, the current through P-channel transistors cannot increase beyond a theoretical maximum of about 13 milliamps, or a practical limit of about 11 milliamps. The practical limit is somewhat lower than the theoretical limit as a result of secondary considerations. Transistor m33 stabilizes the current limiting loop.

FIG. 4 illustrates a current limiting circuit for limiting the current through the N-channel m12 and m13 transistors of FIG. 2. The circuit of FIG. 4 includes six transistors numbers m35–m40, connected as shown. Gates of the m38 and m37 are connected to nodes 18 and 13 of FIG. 2, respectively. Gates of transistors m36 and m35 are connected to nodes 15 and 7, respectively, of FIG. 2. Furthermore, the source of transistors m40 is connected node 7 of FIG. 2. Sizes of the various transistors are noted in FIG. 4. Thus, transistors m38 and m37 are connected to bias points within the circuit of FIG. 2 such that the currents do not change, but remain at 75 micro-amps in the quiescent state. Transistor m35 nominally provides about 3 micro-amps. Normally, the feed current in m37 is substantially larger than the current through m36 so that the voltage on the gate of m40 climbs to the rails, thereby shutting off transistor m40.

If the output of the amplifier is shorted to the power supply, the amplifier will immediately draw large currents through transistors m12, m13 (FIG. 2) resulting in an increase in the voltage of node 7. As the voltage at node 7 increases, the current through transistor m35 also increases. When the current through transistor m35 reaches 75 micro amps, which is an increase by a factor of 25, the voltage at node 25 begins to drop from the rail voltage of, for example, 5 volts. This, ultimately results in m40 turning on, pulling down node 7 and thereby providing current limiting. In other words, the voltage on node 7 is prevented from increasing the current in m12 more than 25 times the quiescent condition on the n-channel. In the example, the practical overall current is limited to about 9 milli-amps.

Thus, FIGS. 1–4 illustrate an amplifier for use with a large load capacitance which achieves a low quiescent current, rail to rail output swings, and current limiting. A particular application of the amplifier is as a voltage bias source for a transceiver configured in accordance with IEEE P1394 specifications. Details of such a transceiver are provided in the above-noted U.S. patent application, which is incorporated by reference herein. For use in a transceiver configured in accordance with IEEE P1394 specifications, the class AB amplifier must be implemented in a standard 5 volt digital CMOS technology characterized by relatively large Vt values for both of the n-channel and p-channel transistors. The amplifier must also operate with power supplies as low as 3 volts for certain low voltage applications. The specific circuit configuration and transistor sizes described above meet those constraints.

Thus, what has been described is an improved class AB amplifier. Although the improved amplifier has been described with reference to specific exemplary embodiments, principles of the invention may be exploited in other embodiments and for other applications as well. For example, although the invention has been described with respect to an embodiment having p-channel and n-channel transistors, other pull-down and pull-up devices may alternatively be employed. The exemplary and illustrative embodiments described herein should not be construed as limiting the scope of the invention.

We claim:

1. An amplifier comprising:

an input stage for converting a differential between a pair of input voltages into a current, said input stage having p-channel and n-channel transistors providing a differential output;

an output stage for providing an output voltage, said output stage having first and second p-channel transistors, and first and second n-channel transistors; wherein said p-channel transistor of said input stage, said first p-channel transistor of said output stage, said first n-channel transistor of said output stage, and said n-channel transistor of said input stage are connected in series between a high voltage source and a ground;

said second p-channel and n-channel transistors of said output stage are connected in series between said high voltage source and said ground; and said first and second p-channel and n-channel transistors of said output stage are cross-coupled with a drain of said first p-channel transistor of said output stage connected to a gate of said second n-channel transistor of said output stage and with a drain of said first n-channel transistor of said output stage connected to a gate of said second p-channel transistor of said output stage; and wherein sizes of said transistors are selected to provide a net amplification of an input differential voltage to said output voltage and to provide a stable quiescent output of about zero volts.

2. The amplifier of claim 1, wherein said output stage also includes third p-channel and n-channel transistors connected, in series, between a drain of said second p-channel transistor of said output stage and a drain of said second n-channel of said output stage.

3. The amplifier of claim 2, further including a biasing stage having a first, second and third p-channel transistors connected in series between the high voltage and the ground; and first and second n-channel transistors connected in series between a biasing current source and ground; and wherein a gate of said second p-channel transistor of said biasing stage is connected to a gate of said first p-channel transistor of said output stage and a gate of said first n-channel transistor of said biasing stage is connected to a gate of said first n-channel transistor of said output stage; and gates of said first and second n-channel transistors of said biasing stage are connected together.

4. The amplifier of claim 1, further including a current limiting network.

5. The amplifier of claim 1 connected to an external capacitor through said output line.

6. A Class AB amplifier comprising:

input and output lines;

an input stage having first and second inputs for receiving voltage signals and a differential output for generating current signals proportional to a difference between the voltage signals received at said first and second inputs, said first and second inputs being coupled respectively to said input and output lines; and an output stage having first and second inputs, said first and second inputs of said output stage being coupled directly to said differential output of said input stage, said first and second input-of said output stage also being coupled to said output line via two pairs of cross-coupled transistor devices.

* * * * *